United States Patent
Park et al.

(10) Patent No.: US 6,729,950 B2
(45) Date of Patent: May 4, 2004

(54) CHEMICAL MECHANICAL POLISHING PAD HAVING WAVE SHAPED GROOVES

(75) Inventors: Inha Park, Ulsan (KR); Tae-Kyoung Kwon, Ulsan (KR); Jaeseok Kim, Ulsan (KR); In-Ju Hwang, Ulsan (KR)

(73) Assignee: SKC Co., Ltd., Kyunggi-Do (KR)

(*) Notice: Subject to any disclaimer, the term of this patent is extended or adjusted under 35 U.S.C. 154(b) by 36 days.

(21) Appl. No.: 10/129,386

(22) PCT Filed: Aug. 29, 2001

(86) PCT No.: PCT/KR01/01464
§ 371 (c)(1),
(2), (4) Date: May 3, 2002

(87) PCT Pub. No.: WO03/017347
PCT Pub. Date: Feb. 27, 2003

(65) Prior Publication Data
US 2003/0034131 A1 Feb. 20, 2003

(30) Foreign Application Priority Data
Aug. 16, 2001 (KR) .......................... 2001-49354

(51) Int. Cl.⁷ ................................................ B24D 11/00
(52) U.S. Cl. .................... 451/528; 451/527; 451/529; 451/921
(58) Field of Search ................. 451/526–530, 451/537, 539, 41, 296, 921

(56) References Cited

U.S. PATENT DOCUMENTS

| | | | | |
|---|---|---|---|---|
| 5,177,908 A | * | 1/1993 | Tuttle | 451/41 |
| 5,329,734 A | * | 7/1994 | Yu | 451/41 |
| 5,645,469 A | * | 7/1997 | Burke et al. | 451/41 |
| 5,650,039 A | * | 7/1997 | Talieh | 216/89 |
| 5,725,420 A | * | 3/1998 | Torii | 451/285 |
| 5,853,317 A | * | 12/1998 | Yamamoto | 451/288 |
| 5,984,769 A | * | 11/1999 | Bennett et al. | 451/527 |
| 6,220,942 B1 | * | 4/2001 | Tolles et al. | 451/65 |
| 6,241,596 B1 | * | 6/2001 | Osterheld et al. | 451/527 |
| 6,261,168 B1 | * | 7/2001 | Jensen et al. | 451/527 |
| 6,273,806 B1 | * | 8/2001 | Bennett et al. | 451/527 |
| 6,332,830 B1 | * | 12/2001 | Okamura et al. | 451/36 |
| 6,443,815 B1 | * | 9/2002 | Williams | 451/56 |

* cited by examiner

*Primary Examiner*—George Nguyen
(74) *Attorney, Agent, or Firm*—Abelman, Frayne & Schwab

(57) ABSTRACT

Disclosed is a chemical mechanical polishing pad formed at a polishing surface thereof with a plurality of concentric wave-shaped grooves having different radiuses while having the same shape. Each groove has a desired depth, width, and shape. The chemical mechanical polishing pad provides effects of effectively controlling a flow of slurry during a polishing process, thereby achieving a stability in the polishing process in terms of a polishing rate, and achieving an enhancement in the planarization of a wafer.

14 Claims, 7 Drawing Sheets

* Debris
♦ Slurry

CHEMICAL MECHANICAL POLISHING PAD HAVING WAVE SHAPED GROOVES

TECHNICAL FIELD

The present invention relates to a polishing pad used in a chemical mechanical polishing process, and more particularly to a chemical mechanical polishing pad formed at a polishing surface thereof with a plurality of wave-shaped concentric grooves of different diameters each having a desired depth, width and shape.

BACKGROUND ART

Generally, chemical mechanical polishing (CMP) is a high precision/mirrored surface polishing method used to obtain global planarization in a semiconductor device manufacturing process. In accordance with such CMP, a slurry is supplied between a polishing pad and a wafer to be polished, so as to chemically etch the surface of the wafer. Using the polishing pad, the etched surface of the wafer is mechanically polished.

Referring to FIG. 1, a typical CMP machine, which is denoted by the reference numeral 1, is schematically illustrated. Also, a CMP method using the CMP machine 1 is schematically illustrated in FIG. 2. The CMP method includes a chemical etching reaction process and a mechanical polishing process, which are conducted using a polishing pad 10 included in the CMP machine 1. The chemical etching reaction is carried out by a slurry 42. That is, the slurry 42 serves to chemically react with the surface of a wafer 30 to be polished, thereby making it possible for the mechanical polishing process, following the chemical etching reaction, to be easily carried out. In the mechanical polishing process, the polishing pad 10, which is fixedly mounted on a platen 20, rotates. The wafer 30, which is firmly held by a retainer ring 32, rotates while oscillating. A slurry containing abrasive particles is supplied to the polishing pad 10 by a slurry supply means 40. The supplied slurry is introduced between the polishing pad 10 and the wafer 30. The introduced abrasive particles come into frictional contact with the wafer 30 by virtue of a relative rotating speed difference between the polishing pad 10 and the wafer 30, so that they conduct mechanical polishing. The slurry 42 is a colloidal liquid containing abrasive particles having a grain size of nanometers. This slurry 42 is spread on the polishing pad 10 during the polishing process. As the polishing pad 10 rotates during the polishing process, the slurry 42 supplied to the polishing pad 10 is outwardly discharged from the periphery of the polishing pad 10 due to a centrifugal force caused by the rotation of the polishing pad 10. In order to achieve an enhanced polishing efficiency, many abrasive particles should remain for a desirable lengthy period of time on the upper surface of the polishing pad 10 so that they participate in the polishing of the wafer. That is, the polishing pad 10 should make the slurry 42 be held on the surface thereof for as long a period of time as possible.

Centrifugal force generated during the rotation of the CMP pad is higher at a position nearer to the periphery of the polishing pad. Due to such a centrifugal force difference between different radial positions on the polishing pad, the slurry on the polishing pad exhibits an increased flow rate as it approaches the periphery of the polishing pad. Thus, the slurry is non-uniformly distributed in the radial direction of the polishing pad. Due to such a non-uniform distribution of the slurry, the wafer is non-uniformly polished because its polishing rate is varied depending on, a radial position of the polishing pad in contact with the wafer's surface. Such a variation in polishing rate affects the planarization of the wafer. As a result, the polishing pad exhibits a considerable difference in polishing rate between its central portion and its peripheral portion. For this reason, it is necessary to uniformly distribute the slurry over the polishing pad by controlling the flow of slurry on the polishing pad.

During the polishing process, the wafer is pressed against the polishing pad so that it comes into frictional contact with abrasive particles. Due to this pressure, however, it may be difficult for the slurry to reach the central portion of the wafer. For this reason, the slurry may be distributed at the central portion of the wafer in, a relatively reduced amount, as compared to the amount at the peripheral portion of the wafer. As a result, the wafer is non-uniformly polished.

In order to solve such a problem, a method has been proposed, in which holes or grooves having a desired width, depth and shape are formed on a CMP pad. Such holes or grooves act to control the flow and distribution of the slurry continuously supplied during the polishing process.

Now, holes or grooves conventionally formed on a polishing pad will be described in conjunction with the annexed drawings.

FIG. 3a is a schematic view illustrating a polishing pad formed with grooves respectively having the form of concentric circles. FIG. 3b is a cross-sectional view taken along the line A—A of FIG. 3a. As shown in FIGS. 3a and 3b, the grooves formed on the polishing pad have the form of concentric circles uniformly spaced apart from one another in a radial direction while having different diameters, respectively. The slurry, which is continuously supplied onto the polishing pad, is forced to move outwardly by a centrifugal force generated as the polishing pad rotates. As a result, during the polishing process, the slurry is temporarily collected in the concentric circular grooves, and then outwardly discharged from those grooves. An example of such concentric circular grooves is disclosed in U.S. Pat. No. 5,984,769.

FIG. 4a is a schematic view illustrating a polishing pad formed with grooves having the form of a lattice. FIG. 4b is a cross-sectional view illustrating the lattice-shaped grooves of FIG. 4a. The polishing pad shown in FIG. 4a has a plurality of grooves extending an X axis and a plurality of grooves extending a Y axis while crossing the X-axis grooves to form a lattice. Such lattice-shaped grooves serve to collect a slurry continuously supplied onto the polishing pad, thereby retarding the discharge of the slurry caused by centrifugal force.

In the case of the conventional polishing pad having grooves uniformly spaced apart from one another, the slurry supplied onto the polishing pad is hindered from flowing toward the central portion of a wafer being polished at regions where the polishing pad is in contact with the wafer. As a result, a degradation in polishing rate occurs at the central portion of the wafer.

Since lattice-shaped grooves extend in an opened state to the periphery of the polishing pad without having any closed portion, the slurry supplied onto the polishing pad is easily discharged from the polishing pad. As a result, the lattice-shaped grooves cause an increased consumption of slurry, as compared to concentric circular grooves. It was also reported that holes cause increased consumption of slurry, as compared to lattice-shaped grooves, because those holes involve a reduction of the cross-sectional area capable of storing slurry. In the case of concentric circular grooves, a superior slurry storage capacity is obtained because each groove has a partially closed structure having vertical groove walls capable of retaining the slurry in the groove against centrifugal force, as compared to other structures. However, this structure has a drawback in that each groove has an insufficient depth corresponding to ¼ of the thickness of the polishing pad.

Since the conventional method, which is used to form grooves at a polishing pad, utilize a cutting process conducted by a lathe or milling, the grooves have a fixed pattern such as concentric circles or a lattice. For this reason, it is difficult to form a groove pattern capable of effectively controlling the flow of a slurry.

In order to solve such a problem, it is necessary to design the shape, density and distribution of grooves, taking into consideration given polishing process conditions such as centrifugal force and wafer position.

DISCLOSURE OF THE INVENTION

Therefore, an object of the invention is to provide a CMP pad for a CMP process which is formed with wave-shaped grooves capable of retarding the discharge rate of a slurry supplied onto a polishing surface while uniformly distributing the slurry over the polishing surface.

Another object of the invention is to provide a CMP pad formed with wave-shaped grooves capable of effectively controlling the flow of a slurry supplied onto the polishing pad during a CMP process.

In accordance with the present invention, these objects are accomplished by providing a CMP pad used for a CMP process, wherein a plurality of wave-shaped concentric grooves of different diameters each having a desired depth, a desired width and a desired shape are formed at a polishing surface of the pad.

BRIEF DESCRIPTION OF THE DRAWINGS

FIG. 3b is a cross-sectional view taken along the line A—A of FIG. 3a;

FIG. 4b is a cross-sectional view illustrating the lattice-shaped grooves shown in FIG. 4a;

BEST MODE FOR CARRYING OUT THE INVENTION

Now, the present invention will be described in detail in terms of its constitution and function, with reference to the annexed drawings.

In accordance with the present invention, a CMP pad is provided which has, at a polishing surface thereof, a plurality of wave-shaped concentric grooves of different diameters each having a desired depth, width and shape.

Figure 1:
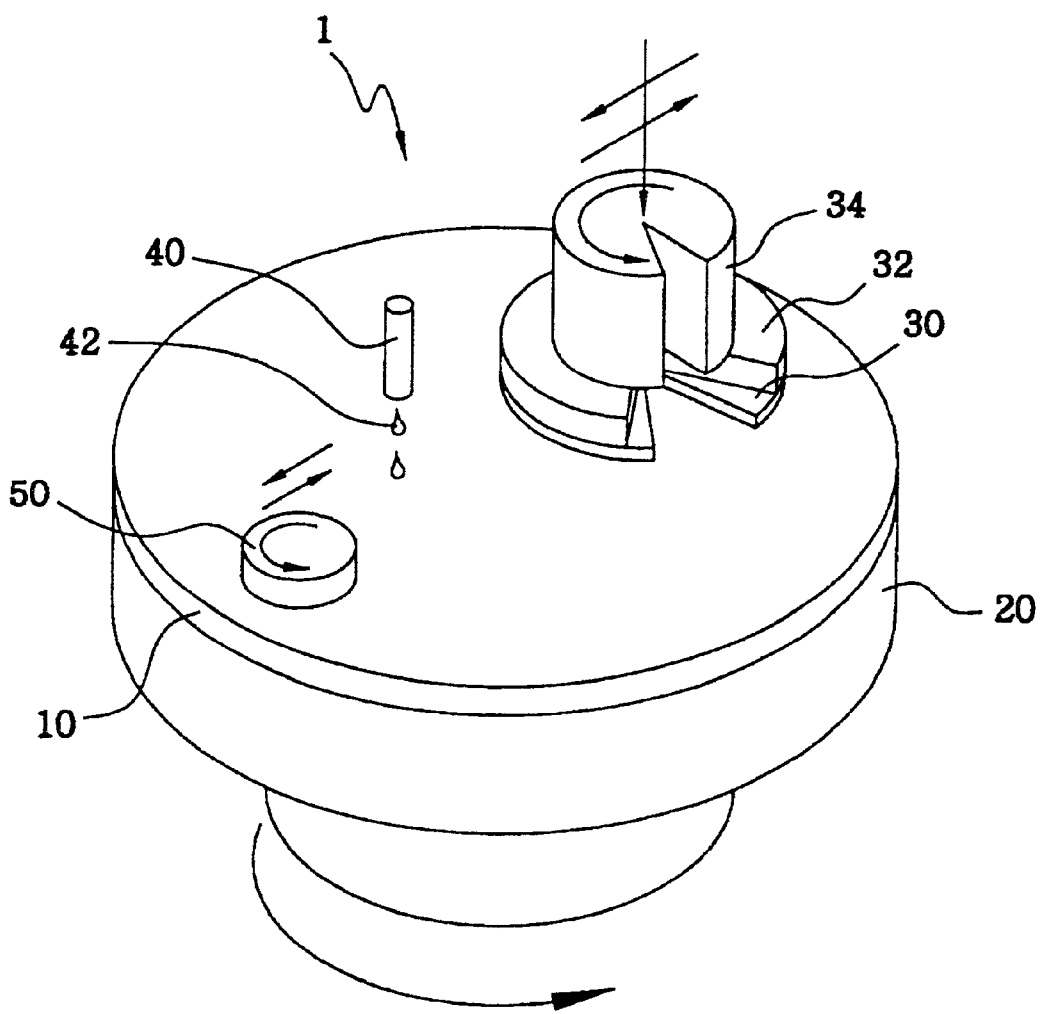
FIG. 1 is a schematic view illustrating the configuration of a typical CMP machine and a polishing method performed using the CMP machine.
Figure 2:
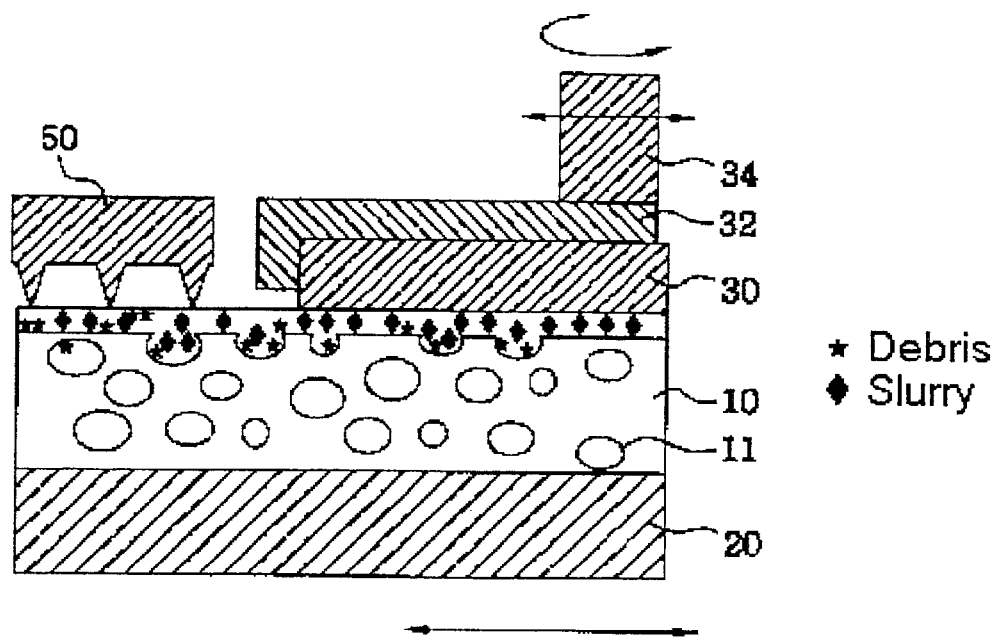
FIG. 2 is a schematic view illustrating the concept of a CMP method.
Figure 3A:
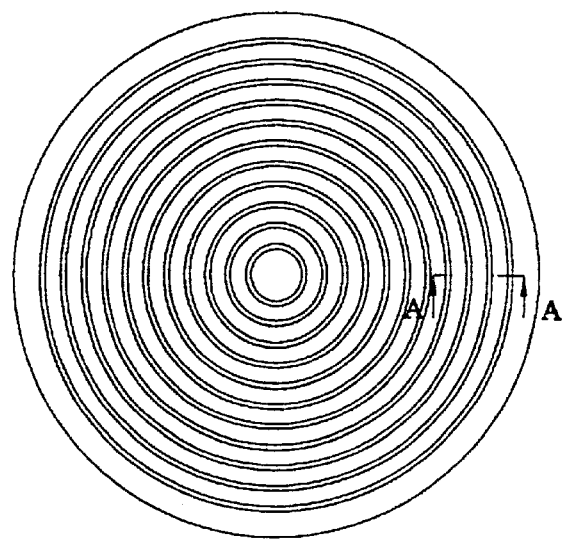
FIG. 3a is a schematic view illustrating a polishing pad formed with grooves respectively having the form of concentric circles.
Figure 3B:
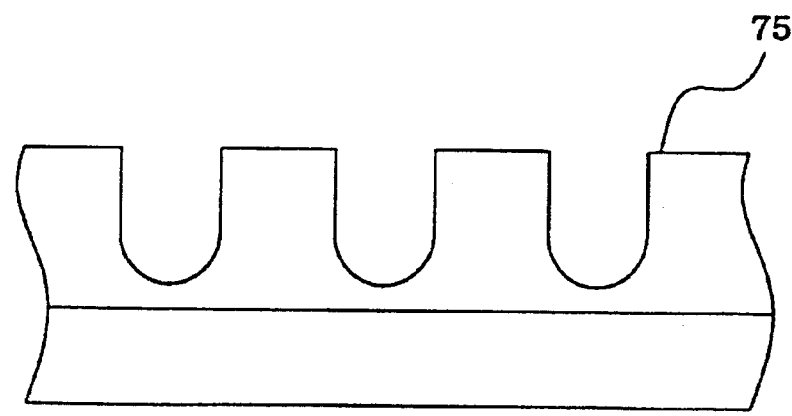
Figure 4A:
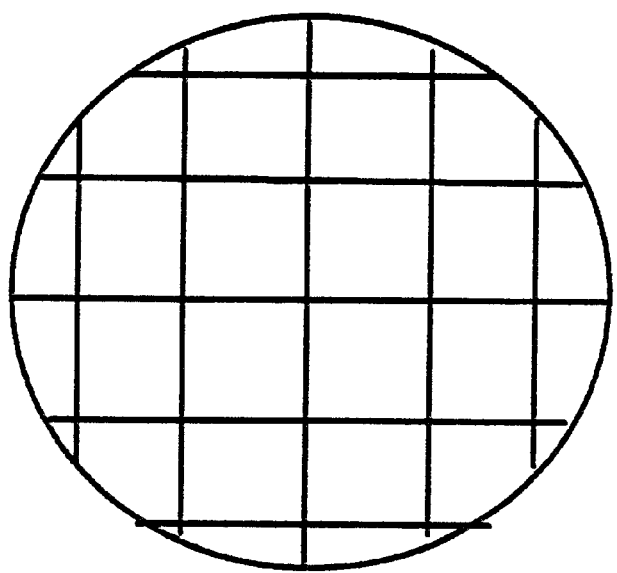
FIG. 4a is a schematic view illustrating a polishing pad formed with lattice-shaped grooves having a conventional structure.
Figure 4B:
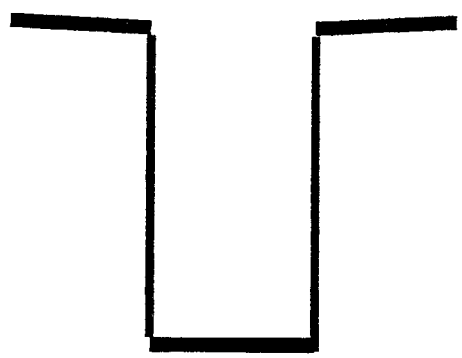
Figure 5:
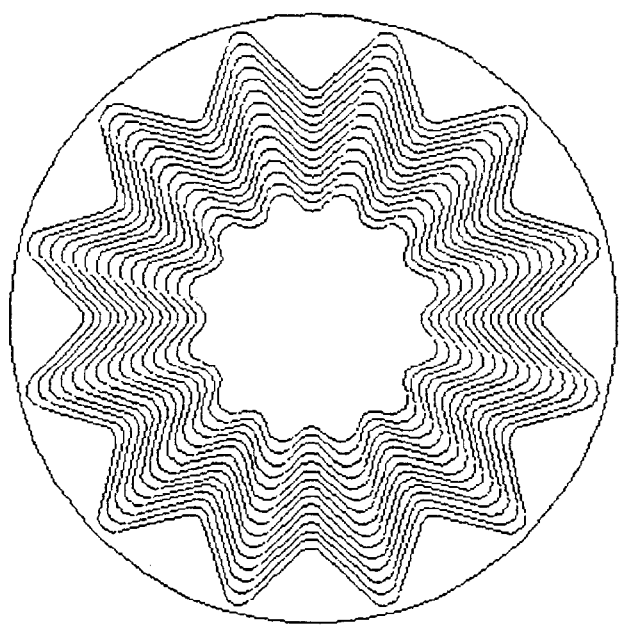
FIGS. 5 and 6 are schematic views respectively illustrating polishing pads each formed with a plurality of wave-shaped concentric grooves having the same shape while having different diameters in accordance with the present invention.
Figure 6:
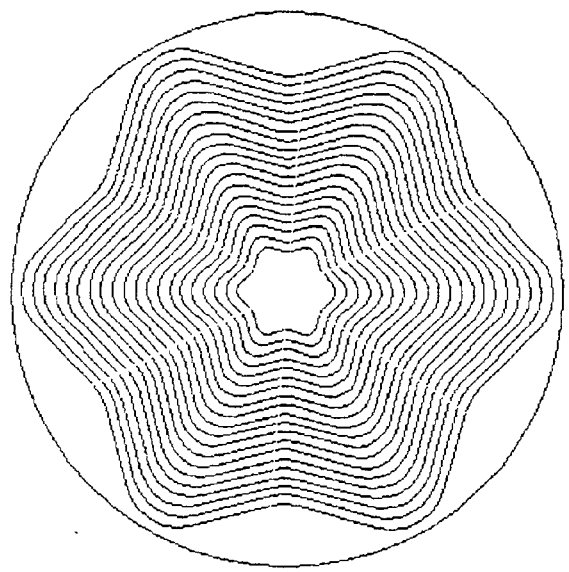
Figure 7:
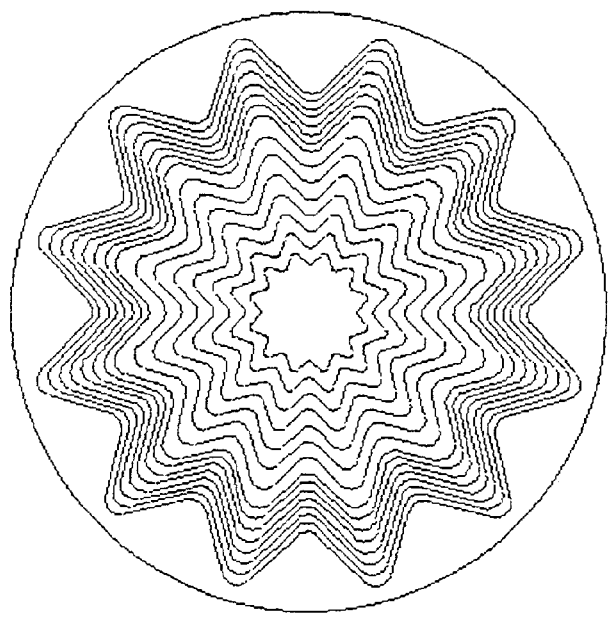
FIGS. 7 and 8 are schematic views respectively illustrating polishing pads each formed with the same grooves as a corresponding one of FIGS. 5 and 6 while being divided into two radial regions having different groove spaces.
Figure 8:
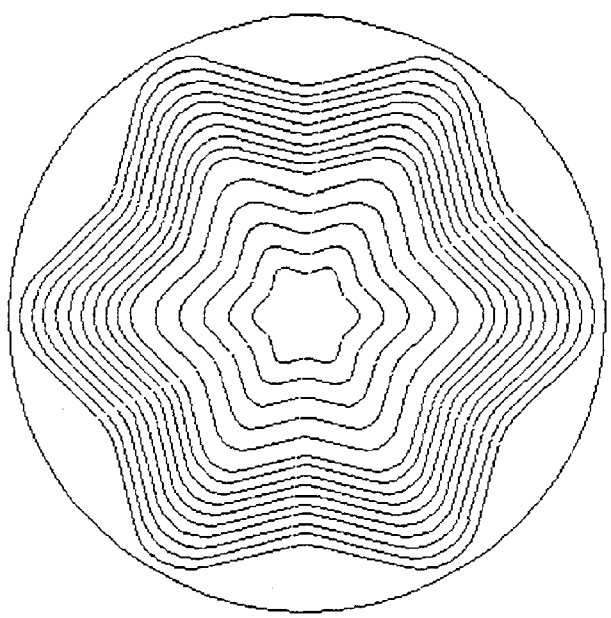
Figure 9:
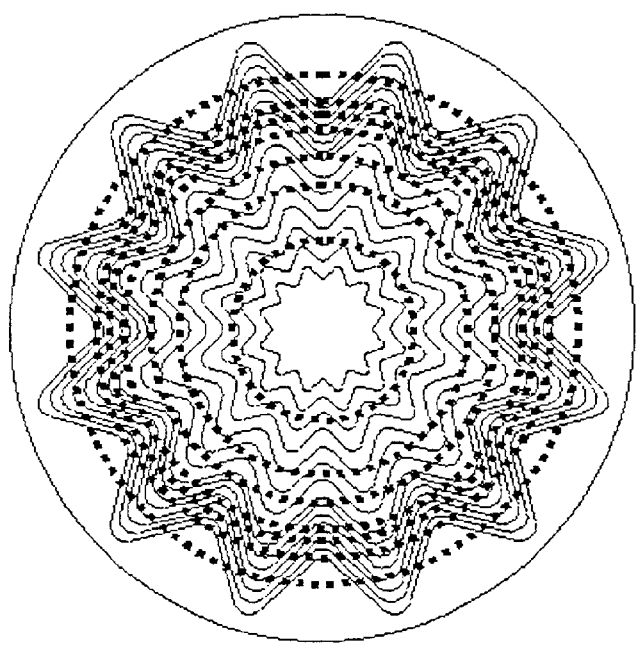
FIG. 9 is a schematic view illustrating the polishing pad of FIG. 7 further formed with a plurality of concentric circles of different diameters each composed of holes.

The wave-shaped grooves of the present invention have the form of concentric sinusoidal loops each having a desired amplitude and a desired number of cycles. Various examples of such wave-shaped grooves are illustrated in FIGS. 5 to 10, respectively. Such wave-shaped concentric grooves each having the form of a sinusoidal loop have diverse shapes in accordance with the number of cycles and amplitude of the sinusoidal loop. For example, the wave-shaped concentric grooves may have an asteroid shape. Preferably, the sinusoidal loop has a number of cycles corresponding to 3 to 1,000. The shape of the grooves may be varied by adjusting the number of cycles and amplitude of the sinusoidal loop in accordance with the given polishing conditions. Referring to FIGS. 5, 7, and 9, wave-shaped concentric grooves each having the form of a sinusoidal loop having a number of cycles corresponding to 12 are illustrated, respectively. Also, FIGS. 6 and 8 illustrate wave-shaped concentric grooves each having the form of a sinusoidal loop having a number of cycles corresponding to 6, respectively.

Such concentric grooves, which have the same wave shape, are formed on a polishing pad while being spaced apart from one another in accordance with the present invention. Preferably, each groove has a width of 10 'Em to 10 mm. Also, the space defined between adjacent ones of the grooves is preferably within a range of 10 'Em to 100 mm.

The wave-shaped concentric grooves formed on the polishing pad may be uniformly or non-uniformly spaced apart from one another. Referring to FIGS. 5 and 6, polishing pads are illustrated, each of which has a plurality of wave-shaped concentric grooves uniformly spaced apart from one another.

The groove space may vary in accordance with the radius thereof. Preferably, the polishing pad has at least two sets of grooves having different groove spaces in order to minimize the non-uniformity of the slurry caused by centrifugal force generated during a polishing process.

For example, the groove space may be gradually reduced from the central portion to the peripheral portion of the polishing pad while being inversely proportional to an increase in the radius thereof.

In accordance with the present invention, the polishing pad may be divided into a plurality of radial regions. Each radial region of the polishing pad may be formed with a plurality of grooves having the same shape while being uniformly spaced apart from one another. Each radial region may have a groove depth, groove width, or groove different from that of the remaining radial region.

As shown in FIG. 6 or 7, the polishing pad may be divided into inner and outer radial regions respectively defined at opposite sides of a circle having a radius $r_0$. The inner radial region has a radius smaller than the radius $r_0$ ($r<r_0$) whereas the outer radial region has a radius larger than the radius $r_0$ ($r > r_0$). Each of the inner and outer radial regions has a uniform groove space. Also, the inner radial region may have a larger groove space than that of the outer radial region.

Concentric circles or lines each composed of holes, grooves, or a combination thereof may be additionally formed on the polishing pad formed with the above described wave-shaped concentric grooves.

Referring to FIG. 9, a polishing pad is illustrated which has, at its polishing surface, a plurality of concentric circles of different diameters each composed of holes, in addition to the grooves shown in FIG. 7. The space between adjacent ones of the concentric circles may be uniform or non-uniform. Also, the circle space may vary gradually in accordance with the radius thereof.

Figure 10:
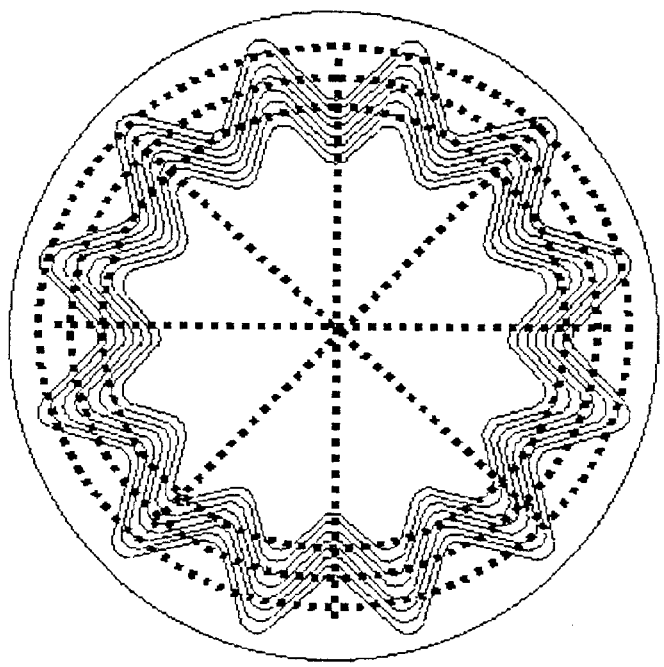
FIG. 10 is a schematic view illustrating a polishing pad formed with a plurality of wave-shaped concentric grooves while being further formed with a plurality of concentric circles of different diameters and diametrical straight lines.

Referring to FIG. 10, a polishing pad is illustrated which has, at its polishing surface, a plurality of concentric circles of different diameters each composed of holes and four diametrically-extending straight lines each composed of holes, in addition to the above described wave-shaped concentric holes. Preferably, the straight lines formed on the polishing pad are symmetrical in a diametrical direction. Of course, it is possible to form straight lines in the form of a lattice or oblique lines.

As apparent from the above description, the present invention provides a polishing pad formed with a plurality of wave-shaped concentric grooves of the same shape while having different diameters. It is possible to make the grooves with diverse patterns by varying the wave shape, groove width, groove depth or groove space. The pattern of the grooves may be further diversified where the polishing pad is additionally formed with a plurality of concentric circles or straight lines each composed of grooves, holes or a combination thereof.

In order to allow the slurry to easily approach the central portion of the wafer during the polishing process, the groove space, width or depth at a portion of the polishing pad most frequently contacting the central portion of the wafer may also be adjusted.

Preferably, the formation of holes or grooves according to the present invention is achieved using a laser machining process. The laser machining process provides advantages in that it is capable of precisely machining holes or grooves having a complicated structure, making the holes or grooves with a smooth inner surface, and easily adjusting the shape, size, and depth of the holes or grooves.

Industrial Applicability

The polishing pad, which is formed with a plurality of wave-shaped concentric grooves having the same shape while having different diameters in accordance with the present invention, is advantageous in that it can have diverse groove and hole patterns capable of optimally meeting the given polishing process conditions.

The wave-shaped grooves of the polishing pad according to the present invention provides an increased area, through which a slurry passes before outwardly being discharged during a polishing process, as compared to grooves having the form of concentric circles. Accordingly, it is possible to retard the discharge rate of the slurry while uniformly distributing the slurry over the polishing surface, and effectively controlling the flow of the slurry during the polishing process, thereby maintaining a stable desired polishing rate and achieving an improved planarization.

Although the preferred embodiments of the invention have been disclosed for illustrative purposes in conjunction with a polishing pad having wave-shaped grooves, those skilled in the art will appreciate that various modifications, additions and substitutions are possible, without departing from the scope and spirit of the invention as disclosed in the accompanying claims.

What is claimed is:

1. A chemical mechanical polishing pad used for a chemical mechanical polishing process, wherein a plurality of wave-shaped concentric grooves of different diameters has the form of a sinusoidal loop having a number of cycles corresponding to 3 to 1,000, each having a desired depth, a desired width and a desired shape are formed at a polishing surface of the pad.

2. The chemical mechanical polishing pad according to claim 1, wherein each of the wave-shaped concentric grooves has a width of 10 'Em to 10 mm.

3. The chemical mechanical polishing pad according to claim 1, wherein the wave-shaped concentric grooves are spaced apart from one another, so as to have a groove space of 10 'Em to 100 mm.

4. The chemical mechanical polishing pad according to claim 1, wherein the wave-shaped concentric grooves are uniformly or non-uniformly spaced apart from one another.

5. The chemical mechanical polishing pad according to claim 1, the wave-shaped concentric grooves are non-uniformly spaced apart from one another so that the groove space defined between adjacent ones of the grooves is gradually reduced from a central portion of the pad to a peripheral portion of the pad.

6. The chemical mechanical polishing pad according to claim 1, wherein the pad is divided into a plurality of radial regions formed with the wave-shaped concentric grooves, the grooves of each of the radial regions having the same groove depth, the same groove width, and the same groove space while each of the radial regions being different from the remaining radial regions in terms of at least one of a groove depth, a groove width, and a groove space.

7. The chemical mechanical polishing pad according to claim 1, wherein a plurality of concentric circles each composed of grooves, holes or a combination thereof are further formed at the polishing surfaces.

8. The chemical mechanical polishing pad according to claim 7, wherein the concentric circles are uniformly or non-uniformly spaced apart from one another so that they are grouped into at least two sets having different groove spaces.

9. The chemical mechanical polishing pad according to claim 7, wherein the concentric circles are spaced apart from one another so that the circle space defined between adjacent ones of the concentric circles is gradually reduced from a central portion of the pad to a peripheral portion of the pad.

10. The chemical mechanical polishing pad according to claim 1, wherein one or more straight lines each composed of grooves, holes or a combination thereof are further formed at the polishing pad.

11. The chemical mechanical polishing pad according to claim 10, wherein the straight lines are grouped into a group of horizontal straight lines spaced apart from one another and a group of vertical straight lines spaced apart from one another while crossing the horizontal straight lines to form a lattice structure.

12. The chemical mechanical polishing pad according to claim 10, wherein the straight lines cross together at a center of the polishing surface so that they are symmetrically arranged in a diametrical direction.

13. The chemical mechanical polishing pad according to claim 1, wherein a plurality of concentric circles each composed of grooves, holes or a combination thereof and one or more straight lines each composed of grooves, holes or a combination thereof are further formed at the polishing surface.

14. The chemical mechanical polishing pad according to claim 1, wherein the wave-shaped grooves are machined by a laser.

* * * * *